United States Patent
Chang

(10) Patent No.: US 7,554,816 B2
(45) Date of Patent: Jun. 30, 2009

(54) SECURING DEVICE

(75) Inventor: Wen-Chang Chang, Keelung (TW)

(73) Assignee: Ted Ju, Keelung (TW)

( * ) Notice: Subject to any disclaimer, the term of this patent is extended or adjusted under 35 U.S.C. 154(b) by 543 days.

(21) Appl. No.: 11/341,419

(22) Filed: Jan. 30, 2006

(65) Prior Publication Data
US 2006/0262509 A1    Nov. 23, 2006

(30) Foreign Application Priority Data
May 23, 2005    (CN) .................... 2005 2 0058532 U

(51) Int. Cl.
*H05K 5/04* (2006.01)
*H05K 5/06* (2006.01)

(52) U.S. Cl. .................... 361/759; 361/807; 361/810

(58) Field of Classification Search ................ 361/759, 361/807, 810, 740, 732, 726, 747, 754; 24/453
See application file for complete search history.

(56) References Cited

U.S. PATENT DOCUMENTS

| 6,971,899 | B1 * | 12/2005 | Liu | 439/326 |
| 7,241,159 | B1 * | 7/2007 | Chen | 439/326 |
| 7,300,298 | B2 * | 11/2007 | Kameda | 439/326 |

FOREIGN PATENT DOCUMENTS

JP    1587349    * 12/2003

* cited by examiner

*Primary Examiner*—Hung S Bui
(74) *Attorney, Agent, or Firm*—Rosenberg, Klein & Lee

(57) ABSTRACT

A securing device comprising a base that may be secured onto a PCB and a movable part that extends from the base, two buckle sections are provided on the movable part to secure an object and the movable part comprising a toggle part connects to each buckle section. The securing device according to the present invention only pulls the toggle to secure or release an interface card, so the securing device is a user-friendly device.

7 Claims, 5 Drawing Sheets

SECURING DEVICE

BACKGROUND OF THE INVENTION

1. Field of the Invention

The present invention relates to a securing device and particularly to a single-piece securing device for an interface card.

2. Description of Related Art

An interface card serves as a bridge for communication between a PC's motherboard and its peripherals. As portable electronic devices have become increasingly smaller, interface cards have as well.

At the present time, taken as an example, a Mini PCI card is inserted horizontally into a laptop PC so as to be inserted into a connector and kept flat close to the basal plane of a board for significantly reducing its occupied height.

In addition to creating a wedging force to the connector, the motherboard generally also provides an interface card with an auxiliary securing device to prevent the interface card from slipping out of the connector due to any impacts or external forces. However, the existing securing device has the disadvantages of being complex, difficult to manufacture, expensive, difficult to operate, and is easily distorted after long, frequent use so that the interface card becomes unsteady and becomes unattached easily.

Thus, a design for a new type of securing device is necessary to prevent the defects mentioned above.

SUMMARY OF THE INVENTION

The present invention provides a novel, user-friendly securing device.

To meet the object mentioned above, the securing device according to the present invention comprises a base that may be secured onto a PCB, and a movable part that extends from the base, in which two buckle sections are provided on the movable part to secure an object. The movable part comprises a toggle part connecting each buckle section.

Compared with the prior art, the securing device according to the present invention only requires the pulling of the toggle to secure or release an interface card. Therefore, the securing device is user-friendly.

In order to further know the features and technical means of the present invention, please refer to the detailed description of the present invention accompanied with drawings; however, the accompanying drawings are provided for reference and illustration only and are not limited to the present invention.

DETAILED DESCRIPTION OF THE PREFERRED EMBODIMENTS

Figure 1:
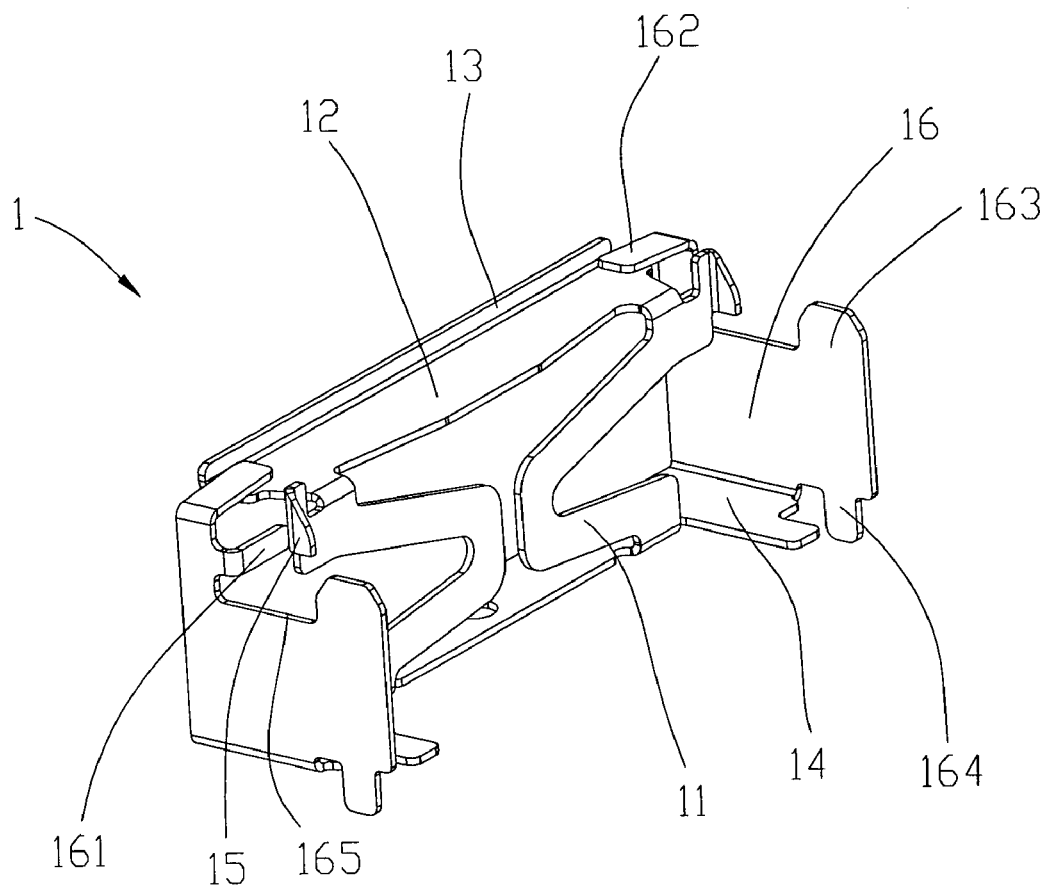
FIG. 1 is a 3D view of a securing device according to the present invention.
Figure 2:
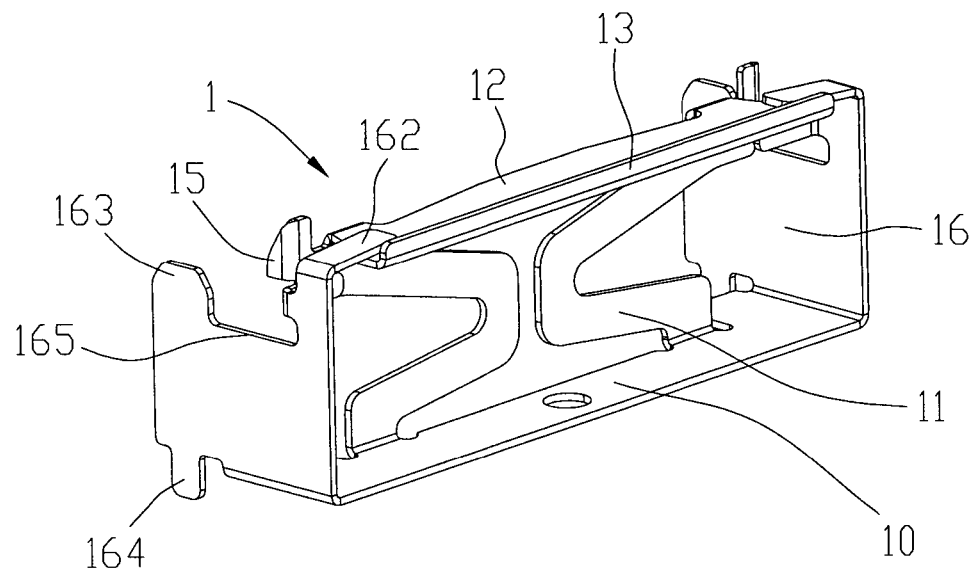
FIG. 2 is a schematic view illustrating the device set in an opposite direction to that of FIG. 1.
Figure 3:
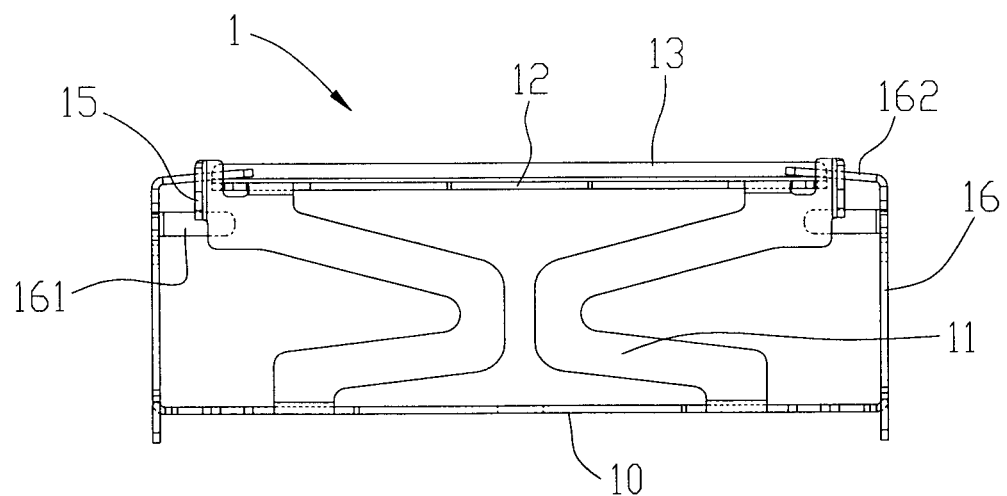
FIG. 3 is a front view of the securing device according to the present invention.
Figure 4:
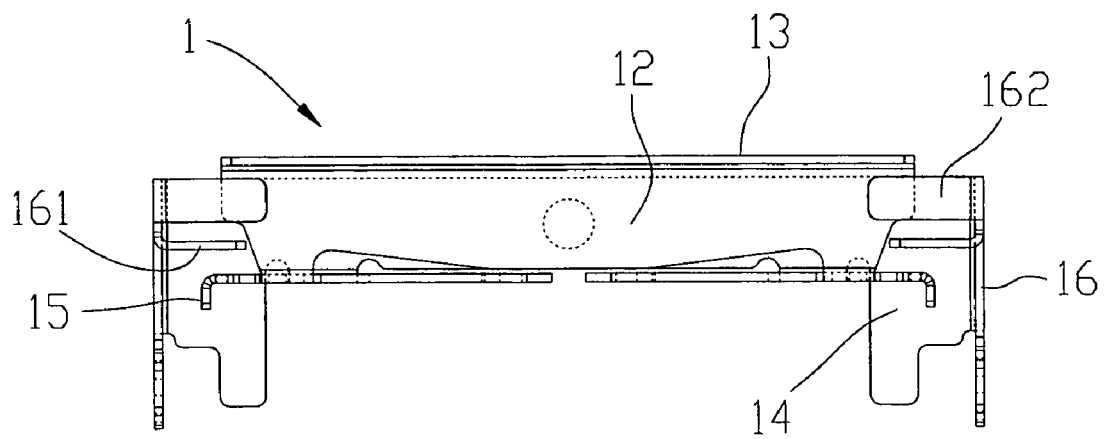
FIG. 4 is a top view of the securing device according to the present invention.
Figure 5:
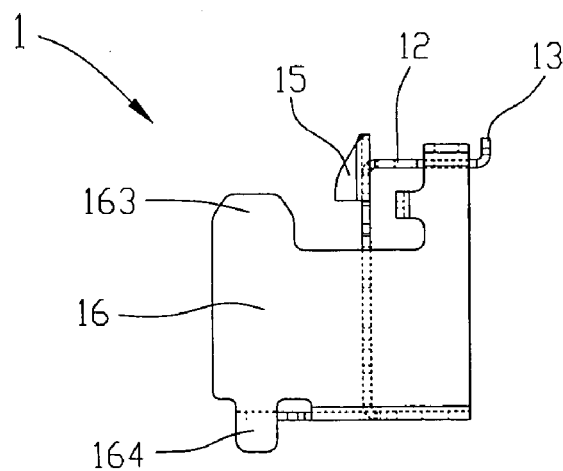
FIG. 5 is a left side view of the securing device according to the present invention.
Figure 6:
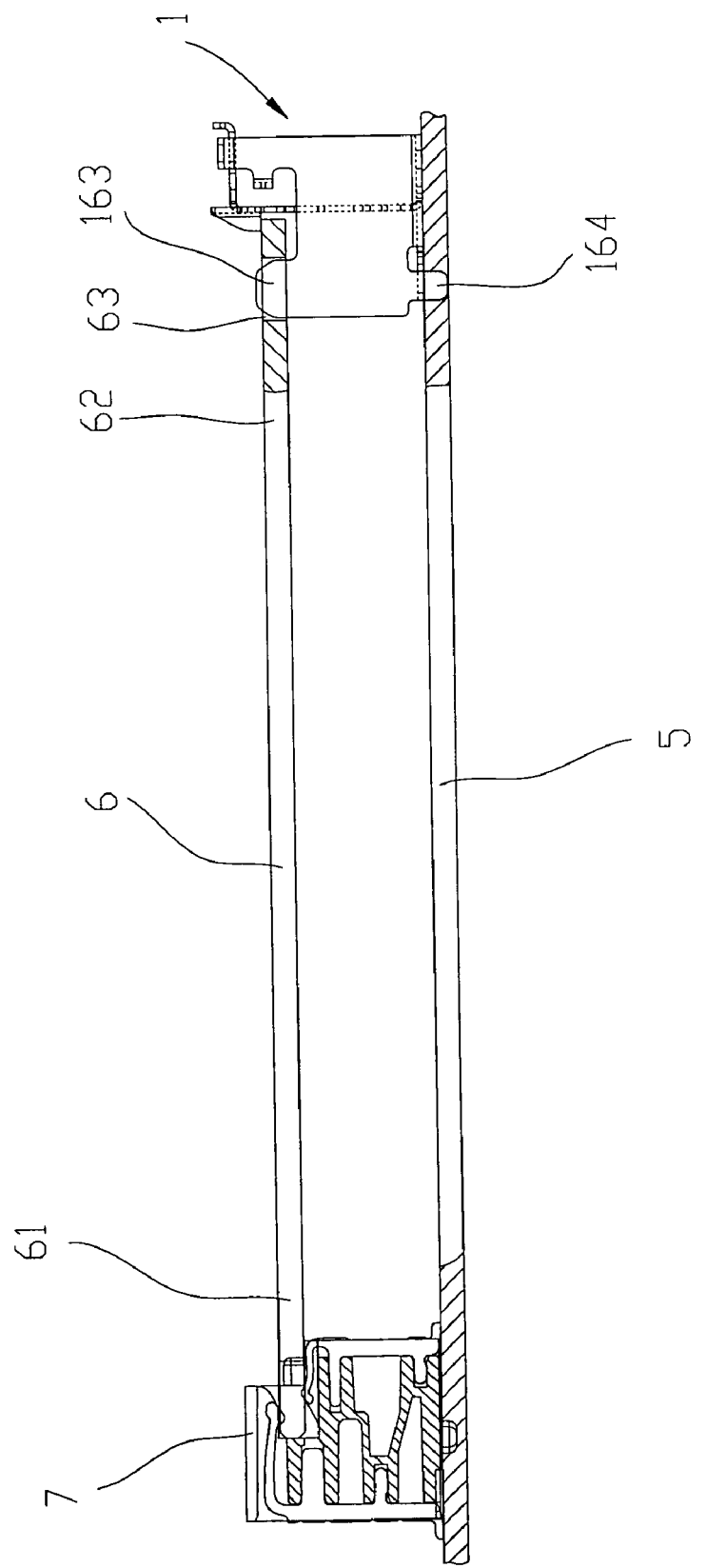
FIG. 6 is a view of an embodiment of the securing device according to the present invention.

In the description mentioned above, only the detailed description and drawings of the embodiments of the single-piece securing device according to the present invention are provided without limit to the present invention and the characteristics of the present invention.

As shown in FIGS. 1 to 6, the securing device 1 according to the present invention is secured onto a PCB 5 so as to secure an interface card 6 (or a butt-joint component, such as a PCB), used together with a wedge connector 7 installed on the PCB 5. The wedge connector 7 is an electrical connector and is connected to a first terminal 61 of an interface card 6. On the interface card, the securing device 1 is secured to a second terminal 62 that is opposite to the first terminal 61, and extends toward the first terminal 61 of the interface card 6, and wedges into the second terminal 62.

The securing device 1 is formed using a piece of metallic material that has been punched and bent, and comprises of a base 10 and a movable part that extends from the base 10. At the two terminals of the base 10 that extend forward, welded parts 14 are provided and welded to the PCB, thereby securing the securing device 1 onto the PCB 5. The movable part comprises two movable arms 11 in the form of an ">" that extend upward from an inside front end of the base 10. Buckle sections 15 are provided at the outside of each top end of each movable arm 11 and bent forward. Plane surfaces of the vertical movable arm 11 and a plane of an interface card 6 are provided to secure the second terminal 62 of the interface card 6. The buckle sections 15 are formed into a transversally bent piece, so they cannot be distorted vertically and thus secure the interface card 6 to prevent the wedge connector 7 from coming out. The toggle 12 lies in between the two buckle sections 15 on the movable part, and is connected to the movable arm 11 and extends horizontally backward. A surface in the center of the toggle 12 is smooth and neat and serves as a vacuum absorption surface for an automation installation apparatus (not shown) to secure the securing device 1 onto the PCB 5. A rib 13 is provided in a post-terminal of the toggle 12 that is bent upwards.

The buckle 1 further comprises two sidewalls 16 extending upward from the base 10, in which each of the sidewalls 16 is provided with a shift-limiting portion 161 that extends inward and prevents the movable part from shifting excessively backward and the shift-limiting portion 161 is arranged behind the top end of movable arm 11. When the movable backward shifts excessively, the shift-limiting portion 161 on the two sidewalls 16 passes the movable arm 11 to prevent the movable part from shifting backward excessively. A stopper 162 extending inward is provided on each sidewall 16 to prevent the movable part from shifting forward excessively. The stopper 162 lies slightly above the shift-limiting portion 161 than the toggle 12 and lies in a specified site before the rib 13. When the movable part shifts forward excessively, the stopper 162 on the two sidewalls 16 penetrates through to wedge the rib 13 to prevent the movable part from shifting forward excessively. The two sidewalls 16 are also provided with top surfaces 165. Clamping pillars 164 are provided protruding downward from the front ends of the two sidewalls 16 to fix the securing device 1 onto the PCB 5, and raised portions 163 are provided upward protruding from the front ends of the two sidewalls 16. A thru hole 63 is provided corresponding to a second end 62 of the interface card 6. When the second end 62 of the interface card 6 fully penetrates the securing device 1, the thru hole 63 sheaths the raised portion 163, and makes the bottom surfaces of the interface card 6 contact the top surfaces 165 of the two sidewalls thereby keeping the interface card 6 horizontal.

When the interface card 6 is installed, a first end 61 of the interface card 6 is firstly inserted into the wedge connector 7 and then the second end 62 of the interface card 6 is pressed downward. When the card reaches the buckle sections 15, because the buckle sections 15 are forced to shift backward, the two thru holes 63 of the second end 62 on the interface card 6 are made to sheath the raised portion 163 and make the thru holes 63 contact the raised portion 163. At this time, the second end 62 of the interface card 6 is buckled to the two buckle sections 15 so that the interface card 6 is firmly secured onto the PCB 5. When being buckled, the interface card 6 is actually horizontal to the PCB 5. If the interface card 6 needs to be pulled, the toggle 12 can be simply pulled backward with force so as to make the buckle sections 15 move backward, thereby the interface card 6 is released. Accordingly, the operation is extremely easy, and the shift-limiting portions 161 and the stoppers 162 are provided on the two sidewalls 16, so the movable part may be prevented from being distorted due to excessive shifting.

Figure 7:
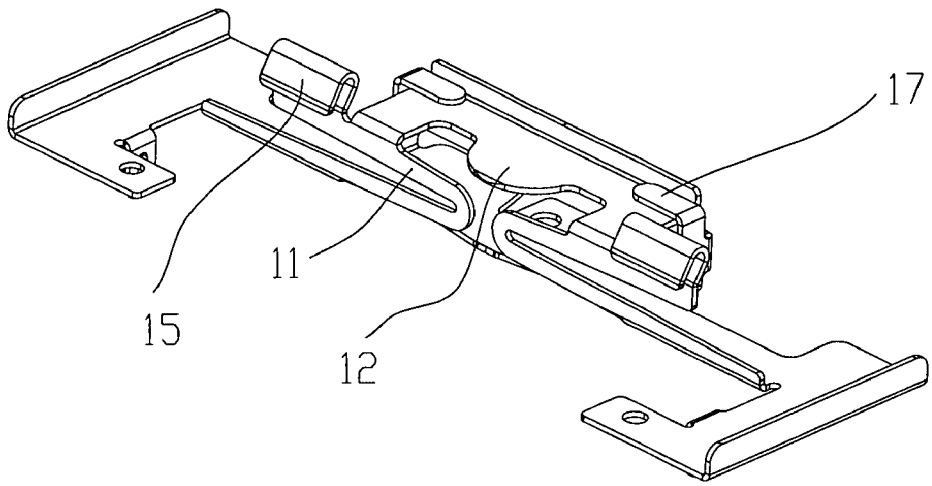
FIG. 7 is a view of another embodiment of the securing device according to the present invention.
Figure 8:
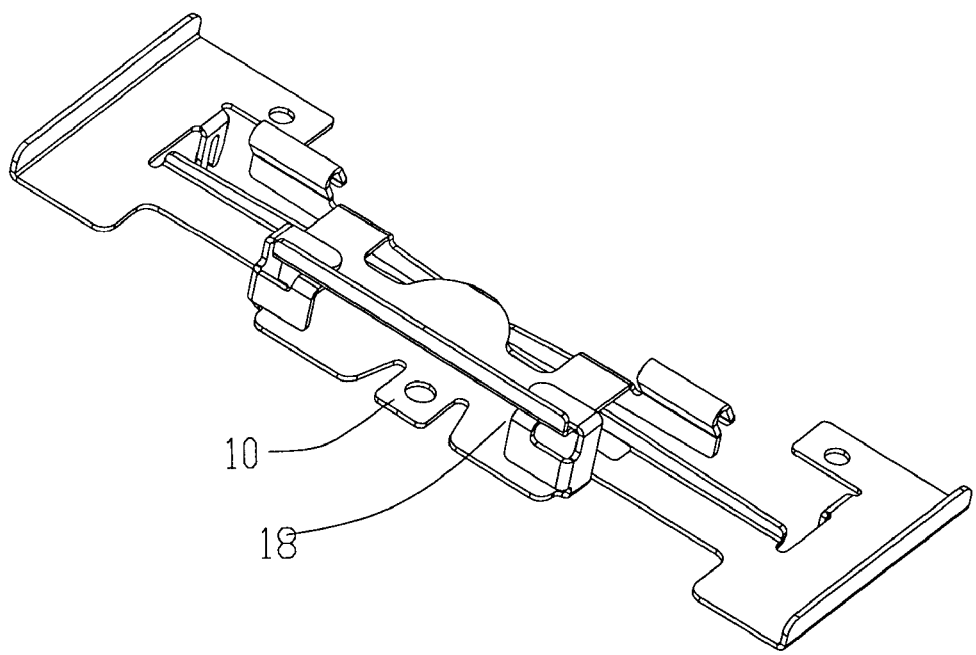
FIG. 8 is a schematic view illustrating the device set in an opposite direction to that of FIG. 7.

FIGS. 7 and 8 are views of two other embodiments of the securing device according to the present invention. The embodiments are different from the description mentioned above in that the toggle 12 that protrudes forward, the buckle section 15 that is bent forward from the top end of movable arm 11 lengthwise, the stopper 17, and the shift-limiting portion 18 are bent directly upward from the two sides behind the base 10.

However, in the description mentioned above, only the preferred embodiments according to the present invention are provided without limit to claims of the present invention; all those skilled in the art without exception should include the equivalent changes and modifications as falling within the true scope and spirit of the present invention.

What is claimed is:

1. A securing device comprising:
   a base for securement to a PCB;
   a movable part that extends from a front end of the base, the movable part including two movable arms, each movable arm being provided with a buckle section for securing an object, the movable part including a toggle disposed between the buckle sections and extending between the movable arms, wherein the secured object is released responsive to the toggle being displaced backwardly; and
   two sidewalls respectively formed on two sides of the base and extending upwardly therefrom, each sidewall having a shift-limiting portion extending inwardly to prevent the movable part from shifting excessively in a rearward direction.

2. The securing device according to claim 1, wherein the securing device is used together with an electrical connector installed on the PCB and a first end and a second end of the object to be buckled are respectively connected to the electrical connector and buckled to the buckle section of the object.

3. The securing device according to claim 1, wherein a surface in a center of toggle is smooth.

4. The securing device according to claim 1, wherein the toggle has a rib extending upwardly from one side thereof.

5. The securing device according to claim 4, wherein each of the sidewalls have a stopper extending inwardly at a location for contacting the rib when the toggle is displaced in a forward direction to thereby prevent the movable part from shifting excessively in the forward direction.

6. The securing device according to claim 1, wherein the buckle section is formed and bent forward from the outside of a top end of the movable arm.

7. The securing device according to claim 1, wherein the buckle section is vertical to a plane of the movable arm and a plane of the object.

* * * * *